United States Patent [19]
Cho

[11] Patent Number: 5,596,287
[45] Date of Patent: Jan. 21, 1997

[54] PROGRAMMABLE LOGIC MODULE FOR DATA PATH APPLICATIONS

[75] Inventor: Han-Jin Cho, Daejeon, Rep. of Korea

[73] Assignee: Electronics and Telecommunications Research Institute, Daejeon-shi, Rep. of Korea

[21] Appl. No.: 343,890

[22] Filed: Nov. 16, 1994

[30] Foreign Application Priority Data

Dec. 23, 1993 [KR] Rep. of Korea ............... 9329352

[51] Int. Cl.$^6$ .................................... H03K 19/177
[52] U.S. Cl. ............................. 326/40; 326/46
[58] Field of Search ................... 326/39, 40, 46; 327/407

[56] References Cited

U.S. PATENT DOCUMENTS

| | | | |
|---|---|---|---|
| 4,717,912 | 1/1988 | Harvey et al. | 326/46 |
| 5,046,035 | 9/1991 | Jigour et al. | 326/39 |
| 5,122,685 | 6/1992 | Chan et al. | 326/40 |
| 5,172,014 | 12/1992 | El Ayat et al. | 326/39 |
| 5,357,153 | 10/1994 | Chiang et al. | 326/39 |

*Primary Examiner*—Edward P. Westin
*Assistant Examiner*—Benjamin D. Driscoll

*Attorney, Agent, or Firm*—Evenson, McKeown, Edwards & Lenahan, P.L.L.C.

[57] ABSTRACT

A logic module for embodying a wide combination of logic and sequential logic in response to a user's demand is divided into a combination circuit part and a sequential circuit part. The combination circuit part is divided into a first stage including a first and a second two-input multiplexers and a second stage. The respective input terminals of the first and second multiplexers are connected to output terminals of two-input AND gates and a first and second input terminals of the two-input AND gates are data and inverted data to select the desired data state. The respective first and second multiplexers have select control input terminals which are connected to an output of an exclusive OR gate having two inputs. The second stage of the combination circuit part includes a third two-input multiplexer of which the first input is connected to the output of the first multiplexer, and a second input is connected to the output of the second multiplexer and a data select control input is connected to an output of a four-input logic gate. The four-input logic gate has two data inputs and two inverted data inputs, thereby embodying the AND combination of two data on demand. The sequential circuit part of a logic module consists of a switching part and a sequential part. The one of outputs from the first and second multiplexers of the combination circuit part is directly selected by the switching part.

7 Claims, 3 Drawing Sheets

PROGRAMMABLE LOGIC MODULE FOR DATA PATH APPLICATIONS

BACKGROUND OF THE INVENTION

The present invention relates to a digital electronic circuit, and more particularly to an integrated circuit capable of embodying a logic function in response to a user's demand.

Although there are several kinds of prior programmable logic circuits, they have different characteristics from each other so that they have been selectively utilized in response to a user's end purpose.

PLAs(Programmable Logic Arrays), FPLAs(Field Programmable Logic Arrays) and FPGAs(Field Programmable Gate Arrays) etc., are typical programmable logic circuits.

A PLA or an FPLA consists of a programmable AND plane and a fixed OR plane so as to embody a specific logic function.

The using rate of a gate is low in cases where a combination of an AND plane and an OR plane performs any specific logic function. Accordingly, the dimensions of a chip are largely occupied.

The known FPGA logic module has an advantage in that it performs a random logic function, but it demands many logic modules to embody sequential logic.

SUMMARY OF THE INVENTION

Accordingly, the present invention solves the above problems, and it is an object of the present invention to provide a logic circuit which is capable of embodying a one-bit adder or a two-bit comparator for a sequential logic, in a combination logic functions of the prior programmable circuits by adding a combination part of a logic module.

To achieve the above-object of the present invention, a logic integrated circuit module including a sequential circuit part is provided and comprises a combination circuit part including first to fourth AND logic structure for respectively inputting a first data signal to a fourth data signal and for ANDing the input data signals, each AND logic structure having two input terminals, said input terminals having at least one non-inverted terminal and one inverted input terminal, XOR logic structure for inputting a fifth and sixth data signals and for XORing the inputted data signals, said XOR logic structure having two non-inverted input terminals, first data select structure having a select control input terminal and for selecting one of outputs from said first and second AND logic structure in response to the output from said XOR logic structure which is applied to the select control input terminal thereof, second data select structure having a select control input terminal and for selecting one of outputs from said third and fourth AND logic structure in response to the output from said XOR logic structure which is applied to the select control input terminal thereof and third data select structure having a select control input terminal and for selecting one of the outputs from said first and second data select structure in response to the output from said fifth AND logic structure which is applied to the select control terminal thereof.

DETAILED DESCRIPTION OF THE PREFERRED EMBODIMENTS

Figure 1:
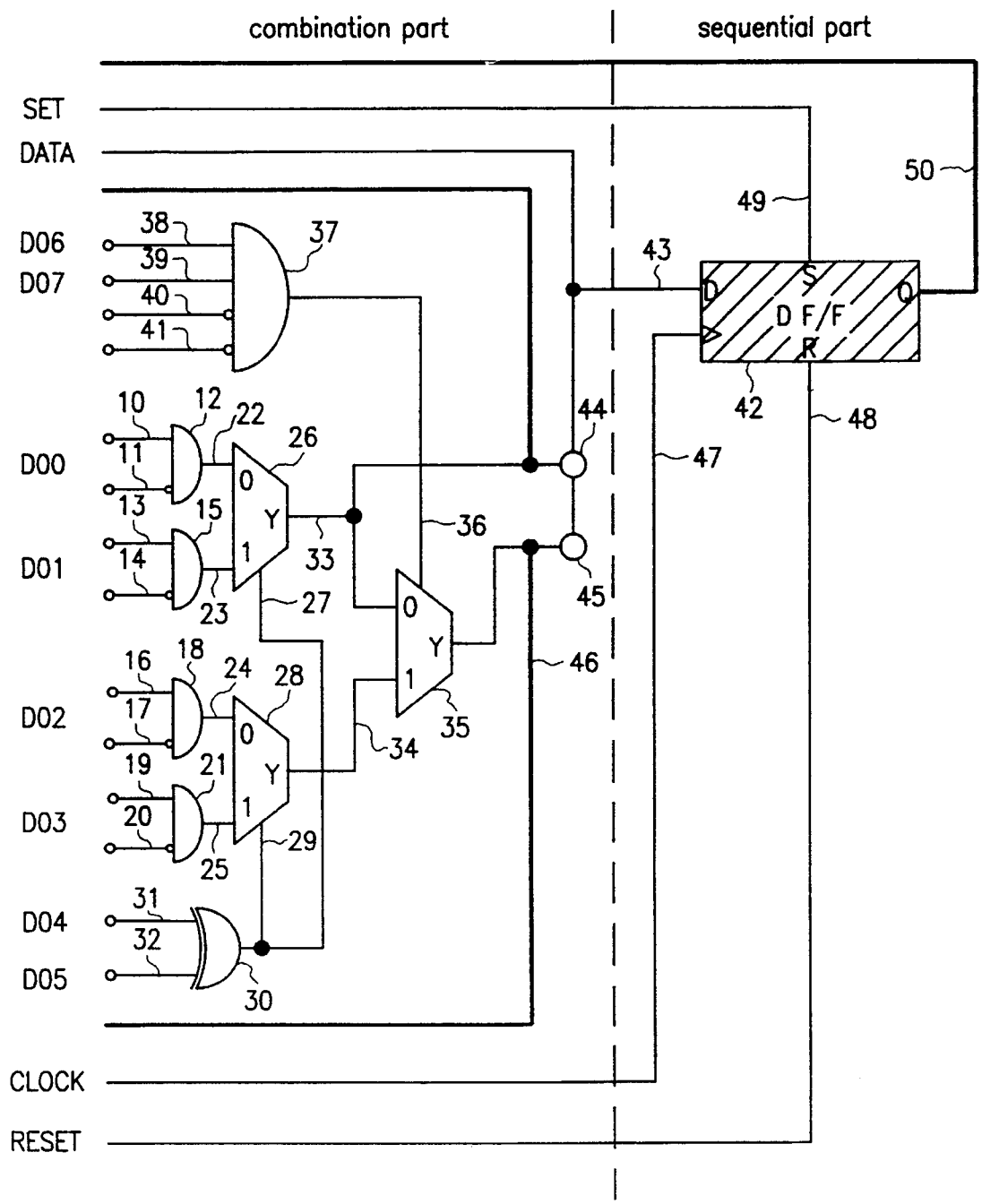
FIG. 1 is a circuit diagram of a logic module in accordance with an embodiment of the invention.

FIG. 1 shows a circuit diagram of a logic module in accordance with the invention.

Referring to drawing, the logic module consists of a combination circuit part and a sequential circuit part.

The combination circuit part of the logic module consists of two stages, and a first stage includes first and second two-input multiplexers 26 and 28 which are data select devices.

The first two-input multiplexer 26 has two input terminals 22 and 23, a select control input terminal 27 and an output terminal 33.

Two input terminals 22 and 23 of the first two-input multiplexer 26 are connected to output terminals of a first AND gate 12 and a second AND gate 15, respectively.

Each of the first and second AND gates 12 and 15 has two data input terminals 10, 11 and 13, 14.

The second multiplexer 28 has two input terminals 24 and 25, a select control input terminal 29 and an output terminal 34. Two input terminals 24 and 25 of said second multiplexer 28 are connected to the output terminals of a third AND gate 18 and a fourth AND gate 21, respectively. Said third AND gate 18 has two data input terminals 16 and 17 and said fourth AND gate 21 has two data input terminals 19 and 20.

The first and second multiplexers 26 and 28 may input an inverted input or a non-inverted input from data input terminals DO0 to DO4 through the four input AND gates 12, 15, 18 and 21. The inverted input terminals and the non-inverted input terminals of unused input terminals are connected to the ground GND and the power supply VDD in order to enable two-input AND gates.

The respective select control input terminals 27 and 29 of the first and second multiplexers 26 and 28 are connected to the output terminal of an exclusive OR(XOR) gate 30 having two input terminals.

The respective output terminals 33 and 34 of the first and second multiplexers 26 and 28 are connected to two input terminals of a third multiplexer 35.

Furthermore, said third multiplexer 35 has a select control input terminal 36 which is connected to an output terminal of a fifth AND gate 37, and an output terminal 46.

The fifth AND gate 37 has four input terminals 38 through 41 where two input terminals 38 and 39 are non-inverted data input terminals and two input terminals 40 and 41 are inverted data input terminals.

The sequential circuit part of the logic module according to the invention consists of a D flip flop 42 having a SET input terminal 49, a RESET input terminal 48, a clock input terminal 47 and a programmable data input terminal 43.

The programmable data input terminal 43 of the D flip flop 42 is directly connected to a data input terminal DATA for externally inputting data and one of the output terminals 33 and 46 of the first and third multiplexers 26 and 35 by two programmable switching devices 44 and 45 where connection may be changeable.

Said switching devices comprise an anti-fuse element consisting of a conductor and an insulator.

The logic module of the invention can obtain the combination logic function in accordance with the 12 maximum inputs when the sequential circuit part is not used.

For example, Table 1 shows the input states of the circuit of FIG. 1 where the combination logic function of AND, OR, NAND, NOR and XOR is used by the module of the invention.

Furthermore, where the same logic functions are embodied, the two inputs can be variously combined and the example of the combination of the inputs is illustrated.

In Table 1, '0' means that the inverted input

TABLE 1

| logic function | input | | | | | | | |
|---|---|---|---|---|---|---|---|---|
| | D06 | D07 | D00 | D01 | D02 | D03 | D04 | D05 |
| AND (ABCD) | A | B | 0 | 0 | 0 | C | D | 0 |
| | A | B | 0 | 0 | C | 0 | C | D |
| | A | B | 0 | 0 | C | 0 | D | 1 |
| OR (A + B + C + D) | A' | B' | 1 | 1 | C | 1 | C | D |
| NAND (ABCD) | A | B | 1 | 1 | C' | 1 | C | D |
| NOR (A + B + C + D) | A' | B' | 0 | 0 | C' | 0 | C | D |
| XOR | A' | B' | 0 | 0 | C' | 0 | D | 0 |
| | A | 0 | B | B' | B' | B | C | D |
| XNOR | A' | 0 | B | B' | B' | B | C | D |

TABLE 2

| logic function | input | | | | | | | |
|---|---|---|---|---|---|---|---|---|
| | D06 | D07 | D00 | D01 | D02 | D03 | D04 | D05 |
| one-bit adder | 1 | 1 | Ci | Ci | B | Ci | A | B |
| two-bit comparator | A0 | 1 | 0 | B0' | 0 | B0 | A' | B1 |
| one-bit adder/ subtracter | 1 | 1 | Ci/Bi | Ci/Bi | B/Bi | Ci/B | A | B | terminals of input terminals of the first to fourth AND gates 12, 15, 24 and 25 are connected to the power supply VDD and the non-inverted input terminals are connected to the ground GND; and, '1' means that the inverted input terminals of input terminals of said two-input AND gates are connected to the ground GND and the non-inverted input terminals are connected to the power supply VDD.

The inputs A, B, C and D signify that the non-inverted input terminals of the input terminals of two-input AND gates 12, 15, 24 and 25 are connected to the data input terminal DATA and the inverted input terminals are connected to the ground GND. The inputs A', B' and C' signify that the inverted input terminals of the input terminals of said two-input AND gates are connected to the data input terminal DATA and the non-inverted input terminals are connected to the power supply VDD.

Figure 2:
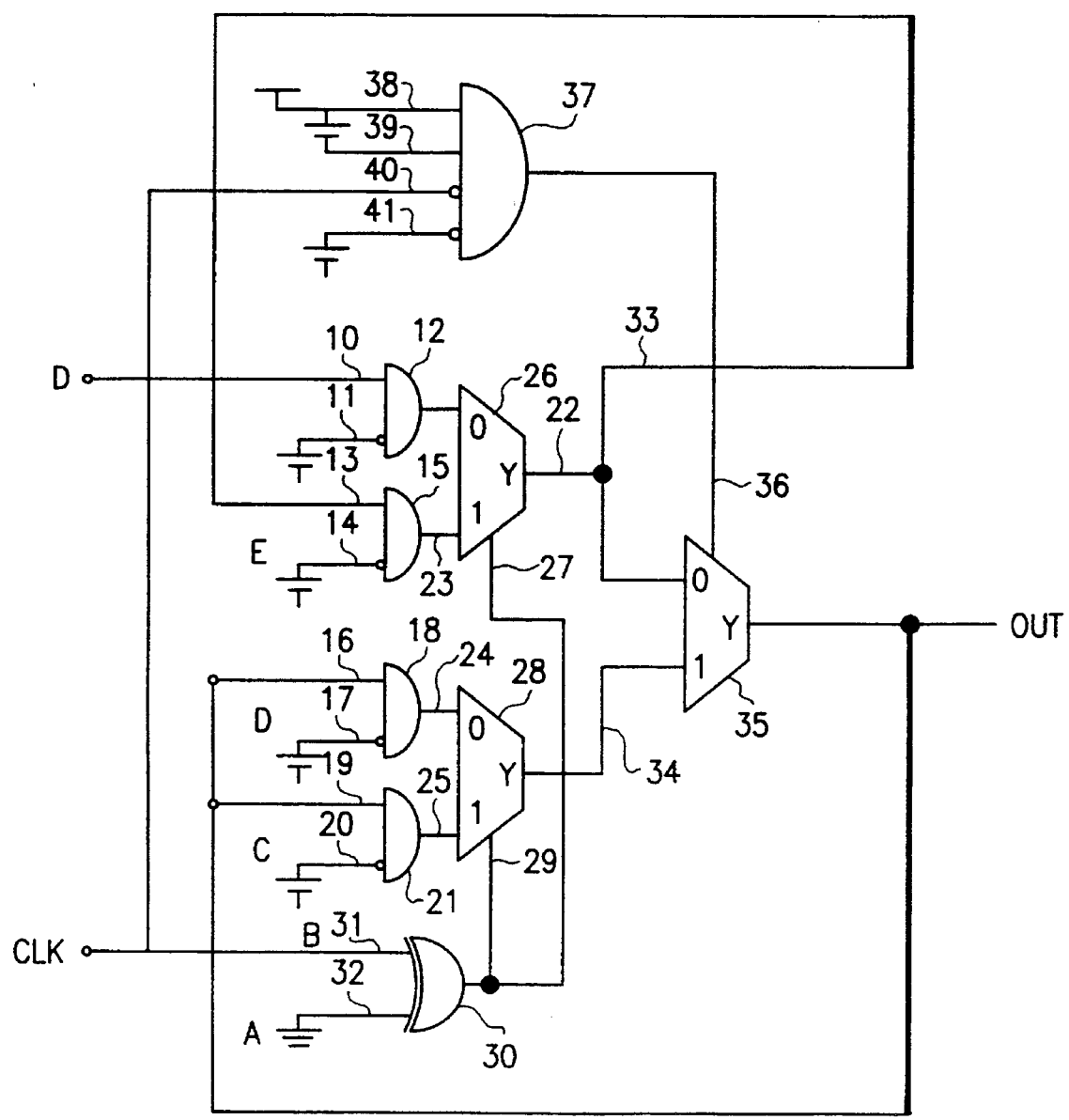
FIG. 2 is a diagram illustrating a connection relation between an input and an output having a flip flop which is triggered at the negative edge of a clock signal and using a combination part of a logic module of the invention.

FIG. 2 shows the circuit added to a clock input terminal 47 of the positive edge-triggered D flip flop of FIG. 1 where the D flip flop which is triggered at the time that a clock signal fall from the high level to the low level uses the combination circuit part of the logic module of the invention.

The additional circuit may be constituted by the combination circuit part according to the invention.

The input terminal 13 of the second AND gate 15 is connected to the output terminal 33 of the first multiplexer 26 and the input terminal 16 of the third AND gate 18 and the input terminal 19 of the fourth AND gate 21 are connected to the output terminal of the third multiplexer 35.

The inverted input terminal 40 or 41 of the four-input AND gate 37 and the input terminal 31 or 32 of the two-input XOR gate 30 are connected to the clock terminal CLK.

The unused input terminals of the four-input AND gate 37 are connected to the VDD or the GND to be enabled.

The unused one of the two input terminals of the two-input XOR gate 30 is connected to the VDD or the GND so as to determine whether the clock signal CLK which is applied to the other input terminal thereof, is inverted or not. Accordingly, in FIG. 2, the unused input terminal 32 thus, the input terminal which the clock signal CLK is not applied to, is connected to the GND so as to obtain a D flip flop which is triggered at the falling edge of the clock signal CLK.

On the other hand, in order to embody a positive edge triggered D flip flop which is triggered at the rising edge of the clock signal CLK, the unused input terminal 32 of the XOR gate 30 is connected to the VDD and one 38 or 39 of the non-inverted input terminals of the four-input AND gate 37 is connected to the clock terminal CLK.

Table 2 shows the input states in case where one-bit adder and two-bit comparator are embodied by using a combination circuit part of the logic module.

In Table 2, A and B are one-bit data to be added, Ci CARRY IN data and Bi BORROW IN data, respectively.

In a one-bit adder, the SUM is outputted from the output terminal 33 of the first multiplexer 26 and the CARRY is outputted from the output terminal 46 of the third multiplexer 35.

In a two-bit comparator, data A1 and A0 and data B1 and B0 are compared. If A1=A0 and B1=B0, the TRUE is outputted from the output terminal of the third multiplexer 35 and if B1≠B0 and A1≠A0, the FALSE is outputted from the output terminal of the third multiplexer 35.

Figure 3:
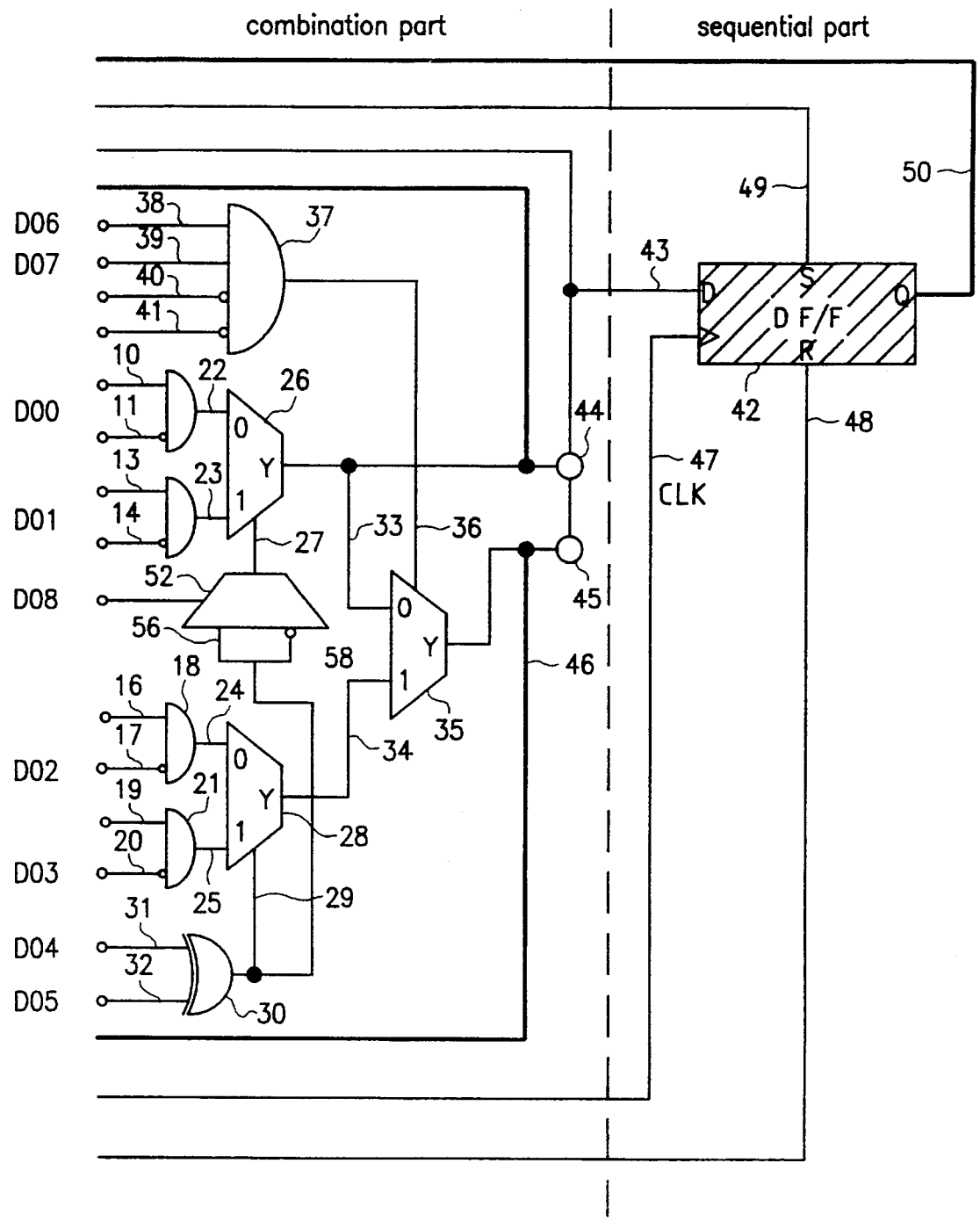
FIG. 3 is a circuit diagram and connection relation between an input and an output having an adder/subtracter and using a modified logic module of the invention.

FIG. 3 shows circuit where a fourth multiplexer 50 is added between the select control input terminals 27 and 29 of the first and second multiplexers 26 and 28 in the first stage.

With the addition of the fourth multiplexer 50, the logic module carries out the function of one-bit adder/subtracter by the data ADD/SUB signal 54 which is applied to the data input terminal DO8 of the fourth multiplexer 50.

The input states are shown in Table 2 and the SUM/DIFF signal is outputted from the output terminal 33 of the first multiplexer 26, and the CARRY/BORROW signal is outputted from the output terminal 46 of the third multiplexer 35.

What is claimed is:

1. A logic integrated circuit module including a sequential circuit part, and a combination circuit part including first to fourth AND logic means for respectively inputting a first data signal to a fourth data signal and for ANDing the input data signals, each AND logic means having two input terminals, said input terminals having at least one non-inverted terminal and one inverted input terminal;

XOR logic means for inputting a fifth and sixth data signals and for XORing the inputted data signals, said XOR logic means having at least two non-inverted input terminals;

fifth AND logic means for inputting a seventh data signal to an eighth data signal and ANDing the input data signals, AND logic means having four input terminals, said input terminals having at least two non-inverted terminals and two inverted input terminals;

first data select means having a select control input terminal and for selecting one of outputs from said first and second AND logic means in response to the output from said XOR logic means which is applied to the select control input terminal thereof; and second data select means having a select control input terminal and for selecting one of outputs from said third and fourth AND logic means in response to the output from said XOR logic means which is applied to the select control input terminal thereof.

2. The logic integrated circuit module as claimed in claim 1, wherein said sequential circuit part includes data storing means having at least one data input terminal and for temporarily storing data signal from said combination circuit part or an external data input terminal, and said combination circuit part further includes switching means for effecting a connecting state between one of output terminals from said first and second data select means and said external data input terminal of said data storing means, said connecting state being changeable.

3. The logic integrated circuit module as claimed in claim 2, wherein said switching means comprise an anti-fuse element.

4. The logic integrated circuit module as claimed in claim 1, wherein said combination circuit part further comprises third data select means having a select control input terminal, a non-inverted input terminal and an inverted-input terminal, and for selecting one of the inverted output and the non-inverted output from said XOR logic means which are applied to said two input terminal thereof, in response to a ninth data signal which is applied to said select control input terminal thereof and for outputting the selected signal to the select control input terminal of said first data select means.

5. The logic integrated circuit module as claimed in claim 4, wherein said sequential circuit part includes data storing means having at least one data input terminal and for temporarily storing the data signal from an external data input terminal or said combination circuit part, and said combination circuit part further includes switching means for effecting a connecting state between one of the output signals from said first and second data select means to said data input terminal of said data storing means, said connecting state being changeable.

6. The logic integrated circuit module as claimed in claim 2, wherein said data storing means comprises one of a flip flop and a latch.

7. The logic integrated circuit module as claimed in claim 5, wherein said switching means comprise an anti-fuse element.

* * * * *